United States Patent
Huber

(10) Patent No.: US 10,263,412 B2
(45) Date of Patent: Apr. 16, 2019

(54) SYSTEM AND METHOD FOR DESATURATION DETECTION

(71) Applicant: Infineon Technologies Austria AG, Villach (AT)

(72) Inventor: Erwin Huber, München (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 284 days.

(21) Appl. No.: 15/388,531

(22) Filed: Dec. 22, 2016

(65) Prior Publication Data

US 2018/0183228 A1 Jun. 28, 2018

(51) Int. Cl.
- H02H 3/00 (2006.01)
- H02H 3/20 (2006.01)
- G01R 19/165 (2006.01)
- H03K 17/082 (2006.01)

(52) U.S. Cl.
CPC ............ *H02H 3/20* (2013.01); *G01R 19/165* (2013.01); *H02H 3/006* (2013.01); *H03K 17/0822* (2013.01); *H03K 17/0828* (2013.01)

(58) Field of Classification Search
USPC ......................................................... 361/86
See application file for complete search history.

(56) References Cited

U.S. PATENT DOCUMENTS

| | | | | |
|---|---|---|---|---|
| 4,893,211 A * | 1/1990 | Bynum | ............... | H03K 17/0822 323/278 |
| 7,936,575 B2 * | 5/2011 | Hu | .................... | H02M 3/33592 363/21.06 |
| 2003/0214770 A1* | 11/2003 | Schimanek | ........ | H03K 17/0822 361/100 |
| 2009/0040796 A1* | 2/2009 | Lalithambika | .... | H02M 3/33507 363/21.17 |
| 2010/0091525 A1* | 4/2010 | Lalithambika | .......... | H02M 1/08 363/21.02 |
| 2015/0277456 A1* | 10/2015 | Illing | ........................ | G05F 1/10 323/265 |
| 2015/0365083 A1* | 12/2015 | Jaeger | .................. | H03K 17/687 327/109 |
| 2016/0036430 A1* | 2/2016 | Rannestad | ......... | H03K 17/0822 363/132 |
| 2017/0214313 A1* | 7/2017 | Kikuchi | .................. | H02H 3/093 |
| 2017/0248646 A1* | 8/2017 | Mauder | ................ | G01R 31/025 |
| 2017/0272068 A1* | 9/2017 | Liang | ................... | H03K 17/567 |
| 2018/0183228 A1* | 6/2018 | Huber | .................. | G01R 19/165 |

* cited by examiner

*Primary Examiner* — Ronald W Leja
(74) *Attorney, Agent, or Firm* — Slater Matsil, LLP

(57) ABSTRACT

In accordance with an embodiment, a method of operating a control circuit includes generating a threshold value based on a drive signal of an external power transistor, and determining an overpower state of the external power transistor based on a voltage at a drain or a collector of the external power transistor and the threshold value.

27 Claims, 9 Drawing Sheets

SYSTEM AND METHOD FOR DESATURATION DETECTION

TECHNICAL FIELD

The present invention relates generally to electronic circuits, and, in particular embodiments, to a system and method for desaturation detection.

BACKGROUND

Generally, inverters for power generators and power supplies use high voltage power semiconductor switches. Power generators and supplies may include devices such as solar panels, wind turbines, grid supplied motors, and uninterruptible power supplies (UPSs). Power semiconductor switches may include devices such as bipolar junction transistors (BJTs), metal-oxide-semiconductor field-effect transistors (MOSFETs), insulated-gate bipolar transistors (IGBTs), and the like. During operation, these power switches may experience an overload condition, which may lead to an overpower condition such as an overcurrent, overvoltage, or over-temperature condition. If an overload condition occurs, damage for the power semiconductor switch may occur leading to destruction of the power semiconductor switch or damage to supplied elements, such as a load supplied by the power supply.

Thus, efforts exist to detect overload conditions, such as overcurrent conditions. Detecting overcurrent conditions may be done using low-voltage devices, such as integrated circuit (IC) devices, which protect the power switch from the overcurrent conditions. One technique for detecting overcurrent conditions involves directly measuring the output current of the switching network, such as with a half-bridge. Another technique for detecting overcurrent conditions involves implementing fast desaturation detection in the switch. During a current overload for a BJT or IGBT, the collector-emitter voltage $V_{CE}$ of the BJT or IGBT increases rapidly while the switch exits saturation, i.e., desaturates. Similarly, during a current overload for a MOSFET, increased currents will lead firstly to an increase of the drain-source voltage $V_{DS}$ of the MOSFET and then, due to further increasing of the current, the MOSFET will enter saturation. Measuring collector-emitter voltage $V_{CE}$ or drain-source voltage $V_{DS}$ is a direct way to determine that the switch has entered a current overload condition. However, semiconductor switches for power generators and supplies may operate at high voltages, and measuring collector-emitter voltage $V_{CE}$ or drain-source voltage $V_{DS}$ may present challenges for measurement using an IC.

SUMMARY

In accordance with an embodiment, a method of operating a control circuit includes generating a threshold value based on a drive signal of an external power transistor, and determining an overpower state of the external power transistor based on a voltage at a drain or a collector of the external power transistor and the threshold value.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
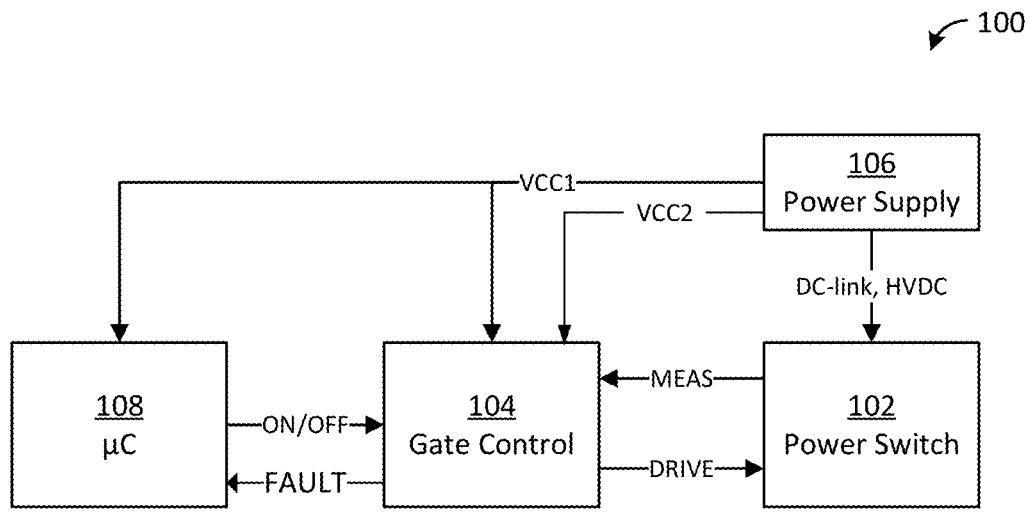
FIG. 1 illustrates a system block diagram of an embodiment switch system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely power transistors, and more particularly, desaturation or overload detection for power transistors. Some of the various embodiments described herein include power transistors including one or more MOSFETs, silicon carbide (SiC) MOSFETs, BJTs, or IGBTs, overload conditions in power transistors, detection of overload conditions in power transistors, desaturation detection for power transistors, and adjustable thresholds for desaturation or overcurrent detection for power transistors. In some cases these overload conditions may include overpower states or conditions that include overcurrent and desaturation for an IGBT and overcurrent and saturation for a MOSFET. These overpower conditions or states may also include an over-temperature condition. In other embodiments, aspects may also be applied to other applications involving any type of electrical switch or transistor according to any fashion as known in the art.

Power transistors may operate in systems that include noise or supply variation, which may further complicate the detection of overcurrent conditions for power transistors. Specifically, the gate voltage applied to a power transistor when the power transistor is turned on has an impact on the maximum current that may flow through the power transistor before desaturation or overcurrent conditions occur. Thus, the desaturation or overcurrent condition of a power transistor is related to the gate voltage used to drive the power transistor. An embodiment control circuit coupled to a power transistor detects an overcurrent condition using a desaturation threshold that is adjusted based on the gate voltage supplied to the power transistor. In such embodiments, the desaturation threshold is compensated based on the gate voltage in order to provide the desaturation threshold as a gate voltage dependent threshold.

According to various embodiments, a control circuit may include a measurement circuit that determines a voltage drop across a power transistor and a threshold circuit that generates and adjusts a desaturation threshold based on the gate voltage supplied to the power transistor, which may be determined indirectly or directly in various embodiments as described further hereinafter. In such embodiments, the voltage drop across the power transistor is compared to the desaturation threshold using a threshold comparator in order to detect desaturation or overload of the power transistor. Based on the result of the comparison, the control circuit may disable the power transistor by disabling a driver for the power transistor. The control circuit also may control a filtering time constant in order to filter out noise that may cause a false detection of desaturation. Adjusting the desaturation threshold may include adjusting the filtering time constant.

FIG. 1 illustrates a system block diagram of an embodiment switch system 100 including power switch 102, gate control circuit 104, power supply 106, and microcontroller 108. According to various embodiments, power switch 102 is controlled to alternatingly conduct and block current supplied by power supply 106. Power switch 102 is controlled by drive signal DRIVE from gate control circuit 104, which also is supplied by power supply 106. In various embodiments, gate control circuit 104 receives measurement signal MEAS from power switch 102. Gate control circuit 104 compares measurement signal MEAS to desaturation threshold $TH_{DES}$ in order to enable or disable power switch 102. Gate control circuit 104 also adjusts desaturation threshold $TH_{DES}$ based on drive signal DRIVE or supply voltages VCC1 or VCC2. Power switch 102 receives a voltage supply from power supply 106 that may be a high voltage DC signal (HVDC) or a DC-link signal and gate control circuit 104 receives supply voltage VCC1 and VCC2. In various embodiments, supply voltage VCC1 and supply voltage VCC2 may be provided from separate power supplies with different voltage levels. For example, supply voltage Vcc1 may be about 5 V and supply voltage VCC2 may be about 15 V in some embodiments, while HVDC or DC-link may be near 1 kV or about 800 V, for example.

In various embodiments, microcontroller 108 is coupled to both power supply 106 and gate control circuit 104. Microcontroller 108 receives supply voltages VCC1 and VCC2, provides enable signal ON/OFF to gate control circuit 104, and receives fault signal FAULT from gate control circuit 104. In some embodiments, microcontroller 108 may be a standard microcontroller. In other embodiments, microcontroller 108 may be implemented as an application specific integrated circuit (ASIC) or may be implemented using a digital signal processor (DSP) or a field programmable gate array (FPGA).

Figure 2:
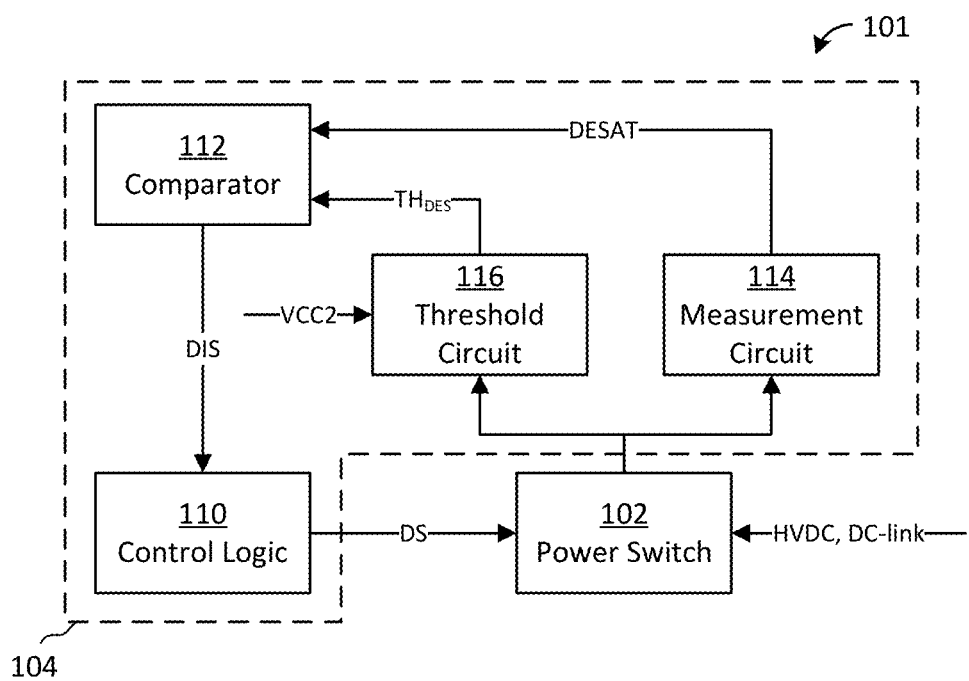
FIG. 2 illustrates a system block diagram of another embodiment switch system.

FIG. 2 illustrates a system block diagram of another embodiment switch system 101 including power switch 102 and gate control circuit 104. According to various embodiments, switch system 101 may be one implementation of switch system 100 that includes additional detail for gate control circuit 104 and omits illustration of power supply 106 and microcontroller 108. In various embodiments, gate control circuit 104 includes control logic 110, comparator 112, measurement circuit 114, and threshold circuit 116. In such embodiments, measurement circuit 114 determines the voltage drop across power switch 102 and threshold circuit 116 determines the gate voltage used to drive power switch 102.

According to various embodiments, measurement circuit 114 generates desaturation signal DESAT based on determining the voltage drop across power switch 102 and threshold circuit 116 generates and adjusts desaturation threshold $TH_{DES}$ based on determining the gate voltage of power switch 102. In such embodiments, measurement circuit 114 may determine the voltage drop across power switch 102 by measuring the collector-emitter voltage $V_{CE}$ when power switch 102 includes a BJT or an IGBT and by measuring the drain-source voltage $V_{DS}$ when power switch 102 includes a MOSFET or an SiC MOSFET. In some embodiments, the voltage drop across power switch 102 is measured indirectly through a measurement interface circuit that protects low voltage elements in measurement circuit 114, comparator 112, or control logic no from high voltages across power switch 102.

According to various embodiments, threshold circuit 116 may determine the gate voltage of power switch 102 by measuring the gate drive voltage directly. In other embodiments, threshold circuit 116 may determine the gate voltage of power switch 102 by measuring the supply voltage for a gate driver of power switch 102 (which may be within control logic no). For example, threshold circuit 116 may measure supply voltage VCC2, which is the supply voltage of the gate driver, in some embodiments. In such embodiments, the supply voltage of the gate driver that drives power switch 102 is equal to, or approximately equal to, the gate drive voltage of power switch 102 when the gate driver is driving power switch 102 in the conducting state. As the gate drive voltage of power switch 102 varies, threshold circuit 116 adjusts desaturation threshold $TH_{DES}$ in order to compensate for the changes in the gate drive voltage.

In various embodiments, comparator 112 receives desaturation threshold $TH_{DES}$ from threshold circuit 116 and desaturation signal DESAT from measurement circuit 114. Based on these signals, comparator 112 generates a disable control signal DIS, which disables power switch 102 through control logic no when desaturation signal DESAT exceeds desaturation threshold $TH_{DES}$. According to various embodiments, desaturation threshold $TH_{DES}$ and desaturation signal DESAT are used to detect overcurrent situations. In some embodiments, desaturation threshold $TH_{DES}$ and desaturation signal DESAT indicate actual desaturation events, such as for BJT devices or IGBT devices, for example. In alternative embodiments, desaturation threshold $TH_{DES}$ and desaturation signal DESAT actually indicate saturation events, such as for MOSFETs, for example.

According to various embodiments, control logic no receives disable control signal DIS from comparator 112 and generates drive signal DS for power switch 102. Control logic 110 may receive additional switching and control information from a microcontroller, other processor, or the like (not shown). Further, in various embodiments, control logic 110 implements a filtering function with a filtering time constant. In such embodiments, the filtering function implemented by control logic no reduces or removes the occurrence of false desaturation detections due to noise or variation within switch system 101, or external to the system, by setting a filtering time constant that filters out desaturation detections that are present for a brief time that is less than the filtering time constant. Thus, the filtering function may act as a high-pass filter (HPF) in some embodiments.

In various embodiments, controller 104 may be implemented using digital circuit elements on an IC. In some embodiments, controller 104 includes analog circuit elements on the IC or external to the IC and coupled to power switch 102. In some embodiments, an all analog approach is used to implement controller 104. In other embodiments, a mixed digital and analog approach is used. For example, some embodiments include control logic no implemented as digital control logic that includes delay elements for implementing the filtering function. Other embodiments include control logic no implemented as an analog control circuit having a controllable filtering time constant, implemented using one or more capacitors, for example, for implementing the filtering function. Further, threshold circuit 116 may be implemented as a digital logic circuit or as an analog control circuit that generates an adjustable desaturation threshold $TH_{DES}$. Further description of various embodiments is provided hereinafter in reference to the other figures.

Figure 3:
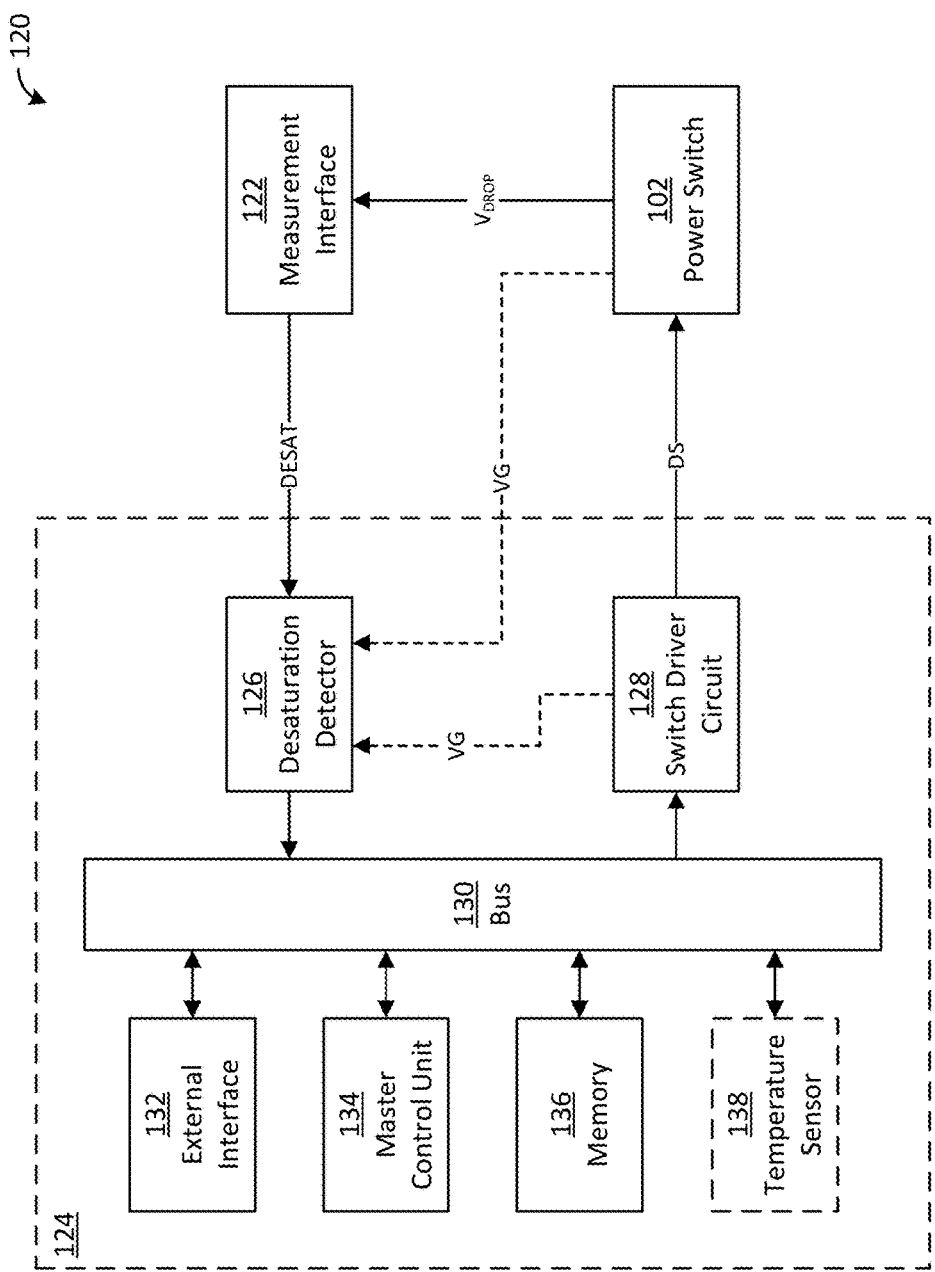
FIG. 3 illustrates a system block diagram of a further embodiment switch system.

FIG. 3 illustrates a system block diagram of a further embodiment switch system 120 including power switch 102, measurement interface 122, and power switch control system 124. Although the different devices in switch system 120 are illustrated as separate blocks, it should be appreciated that some of them may be formed on a same microfabricated die, and some or all of them may be located on a same substrate. In various embodiments, measurement interface 122 may be an implementation of measurement circuit 114 and desaturation detector 126 may be an implementation of comparator 112 and threshold circuit 116 as described hereinabove in reference to FIG. 2. Further, in some embodiments, the devices in switch system 120 are covered by a heat sink (not shown).

According to various embodiments, power switch control system 124 includes desaturation detector 126, switch driver circuit 128, bus 130, external interface 132, master control unit 134 (MCU 134), memory 136, and temperature sensor 138. In various embodiments, some of these elements are omitted or additional elements are included in power switch control system 124. In various embodiments, power switch control system 124 is integrated on a same microfabricated die.

According to various embodiments, measurement interface 122 receives voltage drop VDROP from power switch 102, which is the voltage drop across power switch 102. Measurement interface 122 provides desaturation signal DESAT, which may be, for example, a truncated version of voltage VDROP, to desaturation detector 126. In various embodiments, desaturation detector 126 operates as similarly described hereinabove in reference to threshold circuit 116 and comparator 112 in FIG. 2. Thus, in such embodiments, desaturation detector 126 may include a comparator that compares desaturation signal DESAT, which is based on voltage drop VDROP, to desaturation threshold $TH_{DES}$, which is generated based on gate voltage VG of power switch 102. As described hereinabove, gate voltage VG may be determined directly or indirectly in different embodiments. For example, gate voltage VG may be determined by measuring the supply voltage from switch driver circuit 128 in some embodiments. In other embodiments, gate voltage VG may be determined by measuring the drive voltage of drive signal DS supplied from switch driver circuit 128. In alternative embodiments, gate voltage VG may be determined by measuring the gate voltage directly at power switch 102. In various embodiments, desaturation detector 126 may include a digital-to-analog converter (DAC), and analog-to-digital converter (ADC), or a comparator. In such different embodiments, the ADC may be used to sample values of desaturation signal DESAT or the DAC may be used to generate an analog threshold value for use in an analog comparator.

As discussed hereinabove, an increasing voltage drop VDROP, which corresponds to the collector-emitter voltage $V_{CE}$ for an IGBT or a BJT or the drain-source voltage $V_{DS}$ for a MOSFET, indicates that power switch 102 is experiencing a surge current. As voltage drop VDROP exceeds the threshold, desaturation detector 126 outputs a signal indicating a surge. MCU 134 may then switch off power switch 102 by turning off switch driver circuit 128. In some embodiments, MCU 134 notifies another system of the surge via external interface 132. It should be appreciated that in some embodiments, other surge state detectors may be used.

In various embodiments, bus 130 couples desaturation detector 126, external interface 132, MCU 134, memory 136, switch driver circuit 128, and temperature sensor 138. Devices in power switch control system 124 may be interconnected through bus 130. In alternative embodiments, some elements are not interconnected through bus 130. According to various embodiments, external interface 132 is coupled to bus 130 and provides a digital interface for outside devices to interact with switch system 120. For example, external interface 132 may send a notification to a system that switch system 120 is integrated with indicating a current surge or device failure. In various embodiments, external interface 132 may be a signal line, such as through a dedicated fault pin that pushes fault information to a system controller, an I2C interface that executes an information pull from the system controller, a serial peripheral interface (SPI), a controller area network (CAN) interface, or the like, for example.

According to various embodiments, MCU 134 controls power switch control system 124. In various embodiments, MCU 134 includes functional units and/or circuitry for performing start-up sequences, controlling power modes, optimizing, testing, and debugging power switch control system 124. MCU 134 may include a control state machine or digital logic, which interfaces with desaturation detector 126 and controls power switch 102. According to some embodiments, MCU 134, desaturation detector 126, or both together, controls the sensitivity of overcurrent detection by adjusting desaturation threshold $TH_{DES}$ based on the gate drive voltage of drive signal DS as described hereinabove in reference to FIG. 2. MCU 134 may be a microcontroller, microprocessor, digital signal processor (DSP), digital logic device, application-specific integrated circuit (ASIC), or the like. MCU 134 may be an analog circuit that adjusts desaturation threshold $TH_{DES}$. In some additional embodiments, MCU 134 is included in switch driver circuit 128.

In various embodiments, memory 136 stores values used by MCU 134 or external systems. According to some embodiments, memory 136 stores look-up tables or functions for adjusting desaturation threshold $TH_{DES}$ according to the determined gate voltage of power switch 102. In such embodiments, the look-up tables or functions are used by MCU 134 to adjust desaturation threshold $TH_{DES}$. Memory 136 may be a volatile memory, such as, for example, random access memory (RAM), or may be a non-volatile memory, such as, for example, flash memory.

According to various embodiments, switch driver circuit 128 produces a drive current or drive voltage input for the gate of power switch 102. Switch driver circuit 128 may include a level shifter and an amplifier in some embodiments. In embodiments where switch system 120 is part of a power inverter, MCU 134 may control switch driver circuit 128 according to a desired output waveform. For example, switch driver circuit 128 may be switched on and off with a switching frequency ranging from 1 kHz to 250 kHz, for example. In some embodiments, the switching frequency is modulated in order to produce a modulated output signal with a frequency ranging from 0 to 400 Hz, such as 60 Hz, for example. In alternative embodiments, the switching frequency may be outside these ranges.

According to various embodiments, temperature sensor 138 is optionally included in switch system 120. For example, in some embodiments, temperature sensor 138 is included as part of power switch control system 124. Temperature sensor 138 may be exposed to the ambient environment. In such embodiments, temperature sensor 138 measures the global ambient temperature of switch system 120, which is affected by multiple devices in switch system 120. In some embodiments, for example, temperature sensor 138 measures the ambient temperature of an inverter that includes switch system 120.

In other embodiments, temperature sensor 138 may be located proximate to or in power switch control system 124, such as integrated on a same microfabricated die. In such embodiments, temperature sensor 138 may measure the local ambient temperature near power switch control system 124, or may directly measure junction temperatures of devices in power switch control system 124. In still further embodiments, temperature sensor 138 may be located proximate to or in desaturation detector 126. In such embodiments, temperature sensor 138 may measure the local ambient temperature near desaturation detector 126, or may directly measure junction temperature of devices in desaturation detector 126. In additional embodiments, temperature sensor 138 may be located proximate to or in power switch 102. In such embodiments, temperature sensor 138 may measure the local ambient temperature near power switch 102, may directly measure a junction temperature of power switch 102, or may measure the temperature of a base plate of power switch 102. In various embodiments, MCU 134 may use information from temperature sensor 138 to update control schemes, thresholds, or error signals, for example. According to some alternative embodiments, MCU 134 adjusts desaturation threshold $TH_{DES}$ based on both a temperature signal received from temperature sensor 138 and based on the determined gate voltage of power switch 102, as described hereinabove. In other embodiments, temperature sensor 138 is omitted.

Figure 4A:
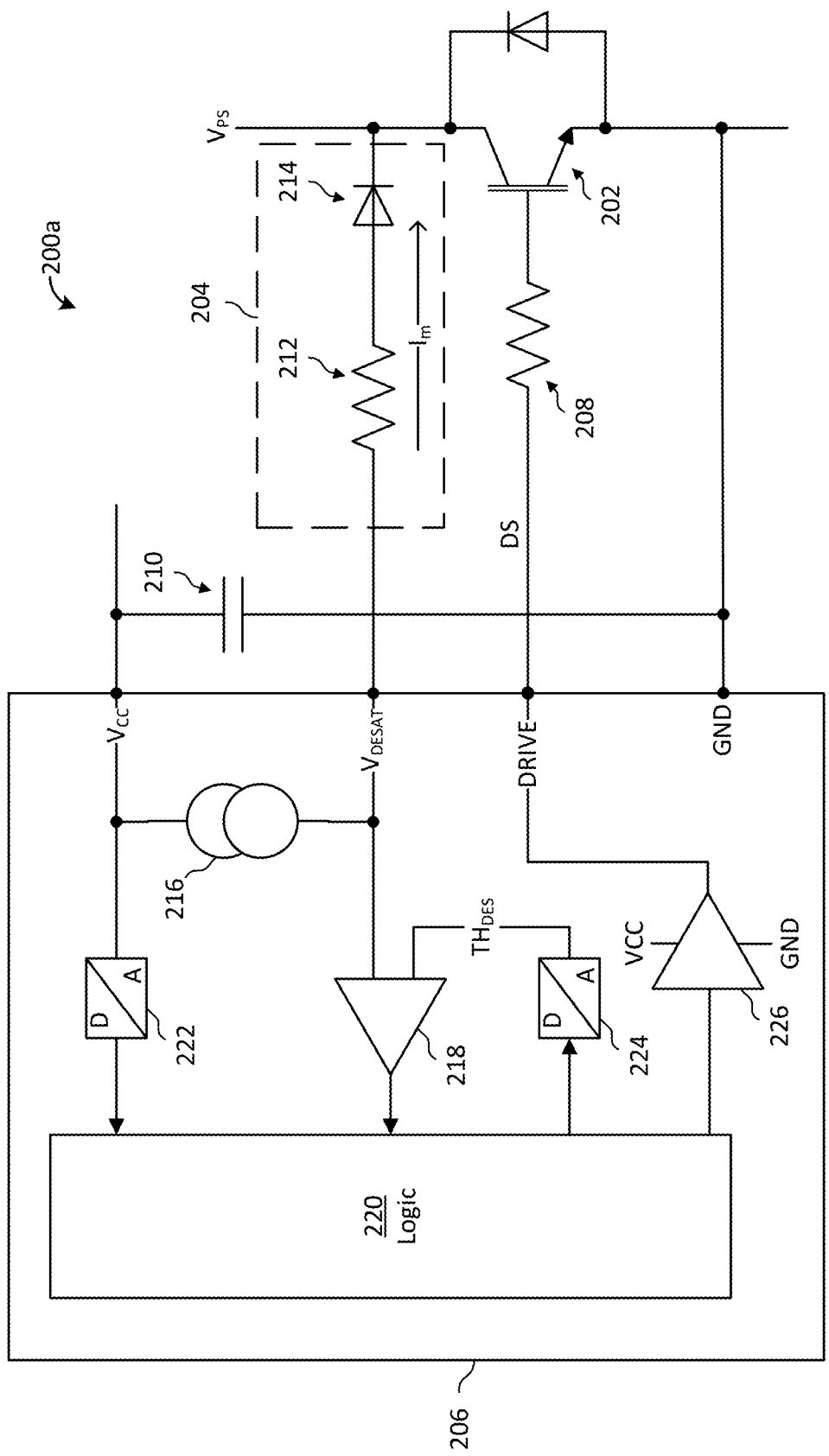
FIGS. 4A, 4B and 4C illustrate schematic diagrams of embodiment switch circuits.
Figure 4B:
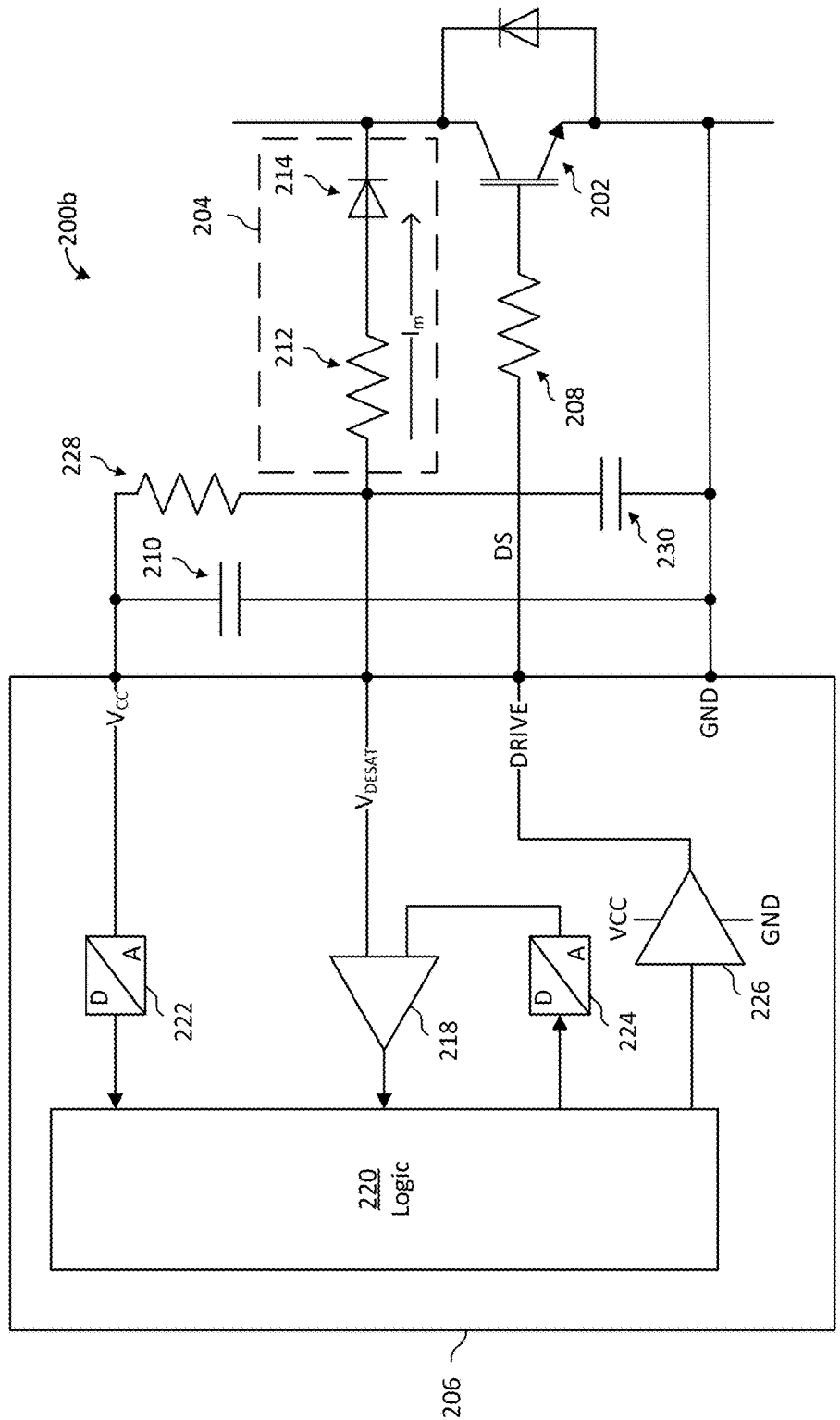

FIGS. 4A and 4B illustrate schematic diagrams of embodiment switch circuit 200a and switch circuit 200b. FIG. 4A illustrates switch circuit 200a, which may be part of a power inverter, for example. According to various embodiments, switch circuit 200a includes power transistor 202, desaturation detector circuit interface 204, and controller 206. Controller 206 may be an implementation of controller 104, as described hereinabove in reference to FIGS. 1 and 2, or of power switch control system 124, as described hereinabove in reference to FIG. 3. In various embodiments, controller 206 includes ADC 222, current source 216, comparator 218, logic circuit 220, DAC 224, and driver 226. Further, controller 206 has a drive terminal coupled through gate resistor 208 to the gate of power transistor 202. Controller 206 also receives supply voltage VCC at a supply terminal, which also includes supply capacitor 210 coupled from the supply terminal, with supply voltage VCC, to a ground terminal, with reference voltage GND. In various embodiments, desaturation detector circuit interface 204 includes desaturation resistor 212 and desaturation diode 214.

According to various embodiments, power transistor 202 is a semiconductor power switch, such as a BJT, IGBT, or MOSFET. In embodiments where power transistor 202 is a MOSFET, power transistor 202 may be an SiC MOSFET. During an overload condition, the collector-emitter voltage $V_{CE}$ (for a BJT or an IGBT) or the drain-source voltage $V_{DS}$ (for a MOSFET) of power transistor 202 may increase as power transistor 202 exhibits an overcurrent situation, which indicates desaturation in a BJT or an IGBT, for example. In embodiments where power transistor 202 is an IGBT, the collector-emitter voltage $V_{CE}$ may have a voltage swing of up to about 1000 V, for example, while conducting or blocking a current from supply voltage VPS. As such, the collector-emitter voltage $V_{CE}$ of power transistor 202 may be indirectly measured.

In various embodiments, desaturation detector circuit interface 204 is coupled to power transistor 202 and indirectly measures the collector-emitter voltage $V_{CE}$ or the drain-source voltage $V_{DS}$ of power transistor 202 (illustrated as an IGBT). Desaturation detector circuit interface 204 includes a high voltage diode, desaturation diode 214, and a protection resistor, desaturation resistor 212, and is coupled to the collector of power transistor 202. Collector-emitter voltage $V_{CE}$ or drain-source voltage $V_{DS}$ is compared to desaturation threshold $TH_{DES}$ by comparator 218 in order to determine whether power transistor 202 is exhibiting an overcurrent situation. Desaturation diode 214 has a voltage drop $V_{Diode}$ in the forward direction. Desaturation resistor 212 has an impedance $R_{prot}$. In some embodiments, the impedance $R_{prot}$ is on the order of kΩ, such as 1 kΩ, for example.

According to various embodiments, current source 216 provides a small measurement current that is directed through desaturation detector circuit interface 204. Based on the voltage at the high voltage node of power transistor 202, for example the collector of an IGBT (as illustrated) or a BJT or the drain of a MOSFET, the current flowing through desaturation detector circuit interface 204, i.e., measurement current $I_m$, produces a small offset to the collector-emitter voltage $V_{CE}$ or the drain-source voltage $V_{DS}$ which sums up to desaturation voltage VDESAT at a desaturation measurement terminal of controller 206. In some embodiments, desaturation detector circuit interface 204 and current source 216 are an implementation of measurement circuit 114 or measurement interface 122 as described hereinabove in reference to FIGS. 2 and 3, for example.

Comparator 218 compares desaturation threshold $TH_{DES}$ to desaturation voltage VDESAT and provides the comparison result to logic circuit 220. For example, according to various specific embodiments, current source 216 is powered by supply voltage $V_{CC}$ and forces measurement current $I_m$ to flow from the desaturation measurement terminal, through desaturation detector circuit interface 204, and to the high voltage conduction terminal of power transistor 202. Desaturation voltage VDESAT can be related to the voltage drop across power transistor 202, which is here described in terms of the collector-emitter voltage $V_{CE}$ for simplicity (but could also be described in terms of the drain-source voltage $V_{DS}$ for a MOSFET), according to:

$$V_{DESAT} = I_m * R_{prot} + V_{Diode} + V_{CE}, \quad (1)$$

where the measurement current $I_m$ is the current flowing through desaturation detector circuit interface 204, the impedance $R_{prot}$ is the resistance of desaturation resistor 212, and the voltage drop $V_{Diode}$ is the voltage drop across desaturation diode 214. In such embodiments, controller 206 measures desaturation detection voltage VDESAT and calculates the collector-emitter voltage $V_{CE}$. The collector-emitter voltage $V_{CE}$ may then be compared to desaturation threshold $TH_{DES}$ generated with a threshold generation circuit in logic circuit 220.

According to various embodiments, ADC 222 samples supply voltage VCC and provides the digital representation of supply voltage VCC to logic circuit 220. In such embodiments, logic circuit 220 sets desaturation threshold $TH_{DES}$ based on supply voltage VCC. Supply voltage VCC is also provided to driver 226, which drives the gate of power transistor 202. In such embodiments, as driver 226 supplies drive signal DS at the drive terminal of controller 206 in order to drive power transistor 202 in a conducting state, the gate voltage of power transistor 202 supplied by driver 226 is equal to, or approximately equal to, supply voltage VCC provided to driver 226. Thus, in such embodiments, ADC 222 indirectly samples the gate drive voltage of power transistor 202 by sampling supply voltage VCC.

According to various embodiments, logic circuit 220 generates and adjusts desaturation threshold $TH_{DES}$ based on the gate drive voltage of power transistor 202, as indicated by supply voltage VCC provided from ADC 222. In various such embodiments, logic circuit 220 may use any number of details or information in order to calculate or determine a particular value of desaturation threshold $TH_{DES}$ based on a determined gate drive voltage. For example, logic circuit 220 may include a look-up table (LUT) in some embodiments. Logic circuit 220 may directly calculate desaturation threshold $TH_{DES}$ based on a set relationship in other embodiments. Logic circuit 220 may include an all digital implementation. In some specific embodiments, logic circuit 220 is implemented as an ASIC. In other embodiments, logic circuit 220 is implemented as a field programmable gate array (FPGA), a microcontroller, or the like. Logic circuit 220 may include a memory or registers, such as for storing the LUT, for example. In alternative embodiments, logic circuit 220 is implemented as an analog control circuit.

In specific embodiments, power transistor 202 has a known, calculated, or determined, such as, e.g., measured, output characteristic that determines the relationship between the current through power transistor 202 and the voltage drop across power transistor 202. For example, the output characteristic of an IGBT or a BJT determines the relationship between the collector current $I_C$ and the collector-emitter voltage $V_{CE}$ and the output characteristic of a MOSFET determines the relationship between the drain current $I_D$ and the drain-source voltage $V_{DS}$. According to various embodiments, the output characteristic of power transistor 202 includes a variation in the relationship between the current through power transistor 202 and the voltage drop across power transistor 202 based on the gate drive voltage of power transistor 202. In such embodiments, the relationship of the output characteristic with the gate drive voltage is known, calculated, or determined, such as, e.g., measured. According to various embodiments, a nominal or target output current may be set in logic circuit 220. In such embodiments, desaturation threshold $TH_{DES}$ may be set according to the voltage drop across power transistor 202 that corresponds to the intersection of the current through power transistor 202 and the nominal or target output current for a determined gate drive voltage of power transistor 202. In various embodiments, desaturation threshold $TH_{DES}$, which is determined by logic circuit 220 based the determined gate voltage of power transistor 202, is provided through DAC 224 to comparator 218 for comparison with desaturation voltage VDESAT from the desaturation measurement terminal of controller 206.

According to various embodiments, driver 226 produces a high-current or high-voltage drive input, drive signal DS, at the drive terminal of controller 206 for driving the gate of power transistor 202. In some embodiments, controller 206 is an application-specific integrated circuit (ASIC) that includes a level shifter and an amplifier, such as, for example, within driver 226. In other embodiments, driver 226 is implemented using an isolated signal transfer across a coreless transformer, a capacitive coupler, an optocoupler, or a magnetic coupler. In such embodiments, controller 206 may produce the higher level drive signal DS from a low-power input signal. Controller 206 may be an IC that includes each element integrated on a same microfabricated die. In alternative embodiments, controller 206 is implemented using discrete components. In other embodiments, controller 206 is implemented with mixed integrated and discrete components.

According to various embodiments, logic circuit 220 may also include a filtering function that filters signal noise and spikes, which may prevent false triggering of desaturation detection. In such embodiments, logic circuit 220 includes a filtering time constant that may implement a high-pass filter (HPF) as described hereinabove in reference to control logic no in FIG. 2. Logic circuit 220 may include asynchronous delay elements or synchronous delay elements in order to implement the filtering time constant in different embodiments.

According to various alternative embodiments, controller 206 is implemented using an all analog implementation. In such embodiments, DAC 224 and ADC 222 may be omitted and logic circuit 220 is implemented as an analog control circuit.

FIG. 4B illustrates switch circuit 200b, which may be part of a power inverter, for example. According to various embodiments, switch circuit 200b includes power transistor 202, desaturation detector circuit interface 204, and controller 206. In various embodiments, switch circuit 200b operates as described hereinabove in reference to switch circuit 200a in FIG. 4A, with the omission of current source 216 and the addition of current sourcing resistor 228 and desaturation filter capacitor 230. In such embodiments, current sourcing resistor 228 provides measurement current $I_m$ through desaturation detector circuit interface 204 to measure the voltage drop across power transistor 202, as described hereinabove in reference to current source 216, but replaced by current sourcing resistor 228, and operating in conjunction with desaturation filter capacitor 230, which filters against noise. In various embodiments, desaturation filter capacitor 230 provides the filtering function described hereinabove in reference to logic circuit 220 in FIG. 4A and described hereinafter in reference to measurement filter 232 in FIG. 5A. According to various embodiments, during desaturation for a BJT or an IGBT, current sourcing resistor 228 and desaturation filter capacitor 230 form a delay circuit. During normal operation, current sourcing resistor 228 and desaturation filter capacitor 230 form a filter. Description of the elements and operation provided hereinabove in reference to switch circuit 200a in FIG. 4A applies to the elements and operation of switch circuit 200b in FIG. 4B with modifications for current sourcing resistor 228 and desaturation filter capacitor 230. In alternative embodiments, current sourcing resistor 228 is included as an integrated component within controller 206 (not shown).

Figure 4C:
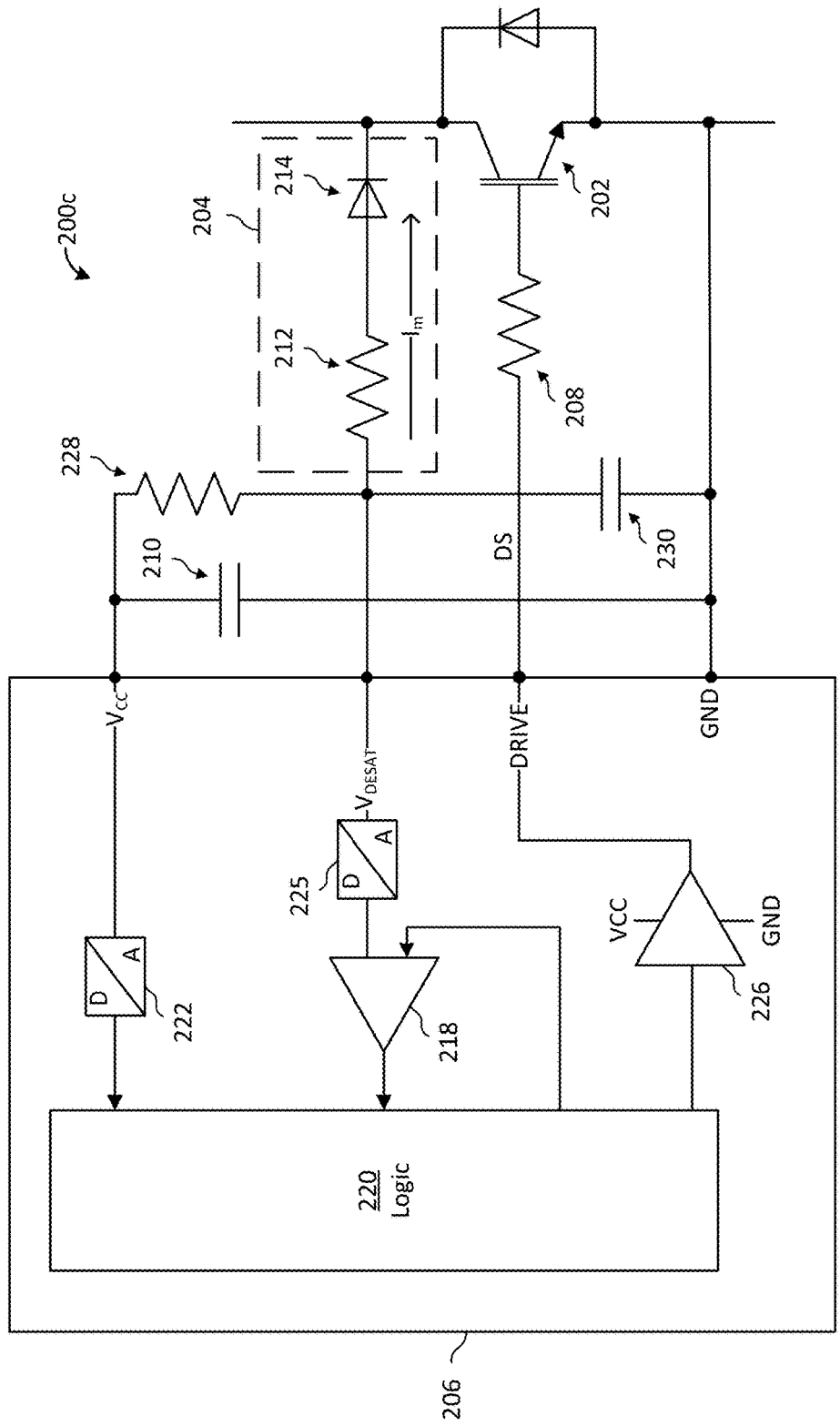

FIG. 4C illustrates switch circuit 200C that is similar to switch circuit 200b of FIG. 4B, with the exception that comparator 218 is implemented in the digital domain instead of the analog domain. Accordingly, analog to digital converter 225 is used to convert voltage $V\text{-}_{DESAT}$ to a digital value prior to comparator 218. In some embodiments, comparator 218 is implemented within logic 220. It should be understood that the digital domain implementation of comparator 218 may also be applied to other embodiments disclosed herein.

Figure 5A:
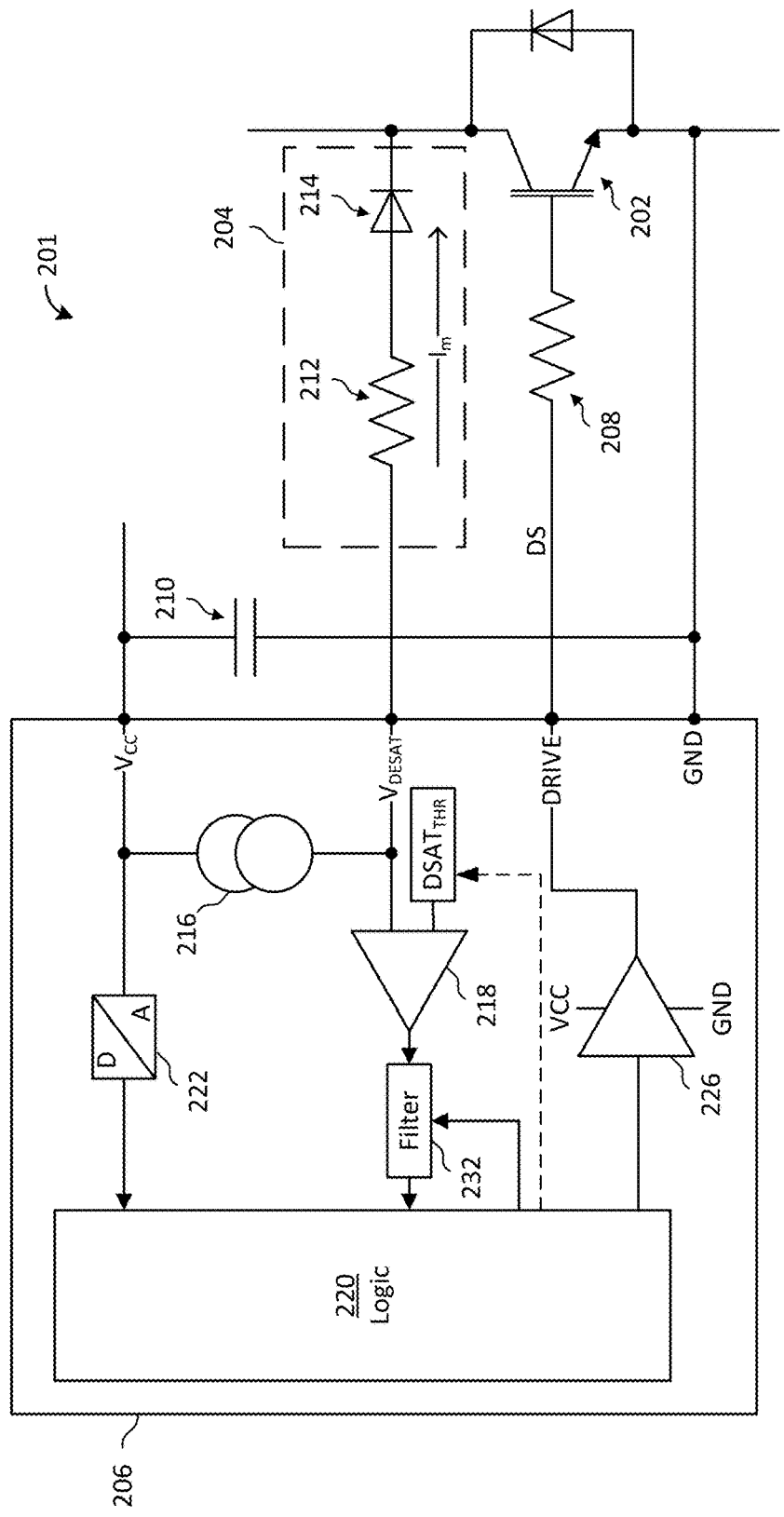
FIGS. 5A and 5B illustrate a schematic diagrams of further embodiment switch circuits.
Figure 5B:
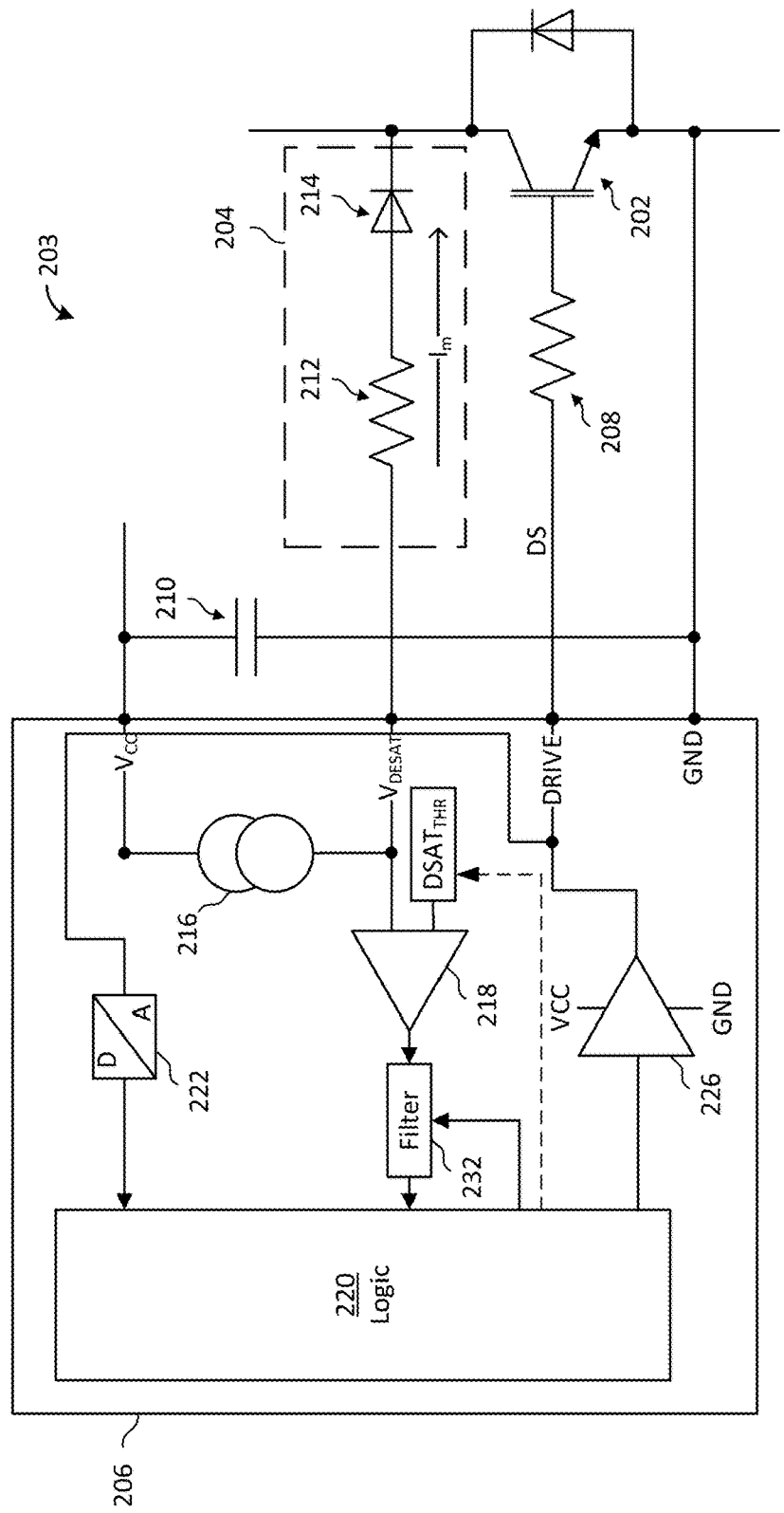

FIG. 5A illustrates a schematic diagram of another embodiment switch circuit 201, which may be part of a power inverter, for example. According to various embodiments, switch circuit 201 includes power transistor 202, desaturation detector circuit interface 204, and controller 206. In various embodiments, switch circuit 201 operates as similarly described hereinabove in reference to switch circuit 200a in FIG. 4A, with the omission of DAC 224 and the addition of measurement filter 232. Measurement filter 232 may implement a filtering function as described hereinabove in reference to control logic no and logic circuit 220 in FIGS. 2 and 4A, respectively, or as described hereinabove in reference to desaturation filter capacitor 230 in FIG. 4B. According to various embodiments, logic circuit 220 adjusts the filtering time constant of measurement filter 232 based on supply voltage VCC sampled by ADC 222 (FIG. 5A) or based on drive signal DS as illustrated in FIG. 5B showing circuit switch 203 in which the input to ADC 222 connected between driver 226 and resistor 208. In some embodiments, the input to ADC 222 may be connected between resistor 208 and the gate of power transistor 202. In some embodiments, adjusting the sensitivity of desaturation detection may be implemented by adjusting the filtering time constant of measurement filter 232 while desaturation threshold value $DSAT_{THR}$ supplied to comparator 218 is a constant threshold value.

According to various embodiments, measurement filter 232 may be implemented using analog filter elements within controller 206 or using digital filter elements within controller 206. In various embodiments, the stress experienced by power transistor 202 during an overcurrent or short circuit event, such as a desaturation event for an IGBT or a BJT, is affected by the filtering time constant of measurement filter 232 (or another filtering element as described hereinabove in reference to other embodiments described in reference to FIGS. 4A and 4B, for example). Thus, reducing the filtering time constant in some embodiments may reduce the stress experienced by power transistor 202 during an overcurrent or short circuit event, such as a desaturation event for an IGBT or a BJT. In some particular embodiments, the filtering time constant may be set based on the amount of stress that a particular power transistor 202 is specified to tolerate.

In some alternative embodiments, desaturation threshold value $DSAT_{THR}$ may also be varied by logic circuit 220 based on supply voltage VCC or drive signal DS, as described hereinabove in reference to the other embodiments and indicated by the dashed line from logic circuit 220 to desaturation threshold value $DSAT_{THR}$. In such embodiments, both desaturation threshold value $DSAT_{THR}$, which is used in such embodiments to operate similarly desaturation threshold $TH_{DES}$, and the filtering time constant of measurement filter 232 are adjusted to control the sensitivity of the desaturation detection or overcurrent detection. Description of the elements and operation provided hereinabove in reference to switch circuit 200a in FIG. 4A applies to the elements and operation of switch circuit 201 in FIG. 5A with modifications for measurement filter 232.

Figure 6:
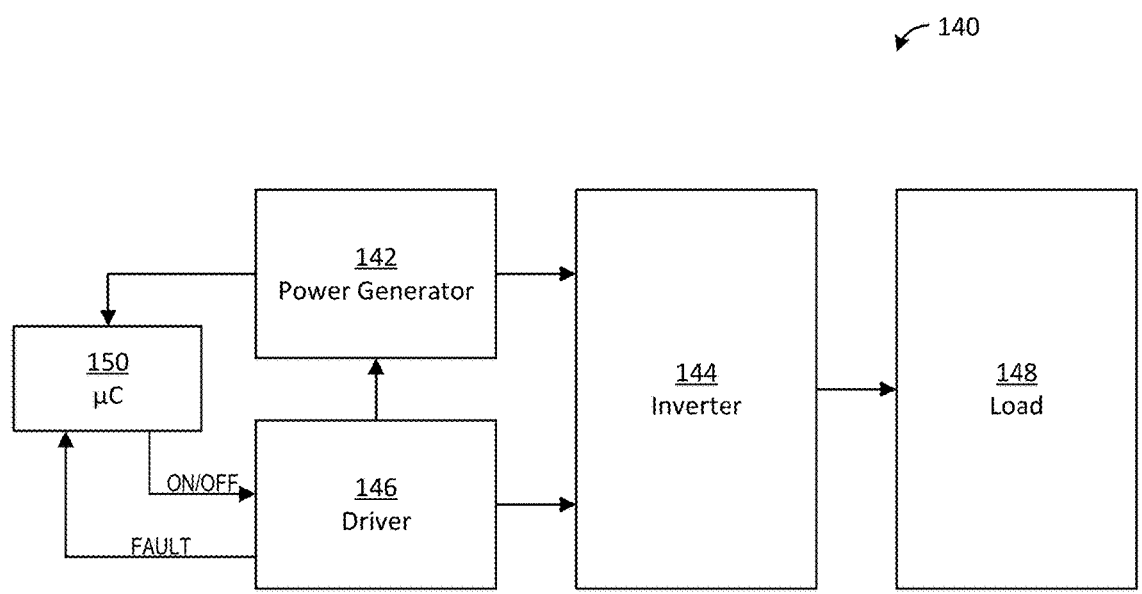
FIG. 6 illustrates a system block diagram of an embodiment power system.

FIG. 6 illustrates a system block diagram of an embodiment power system 140 including power generator 142, inverter 144, driver 146, load 148, and microcontroller 150. In such embodiments, power system 140 is an example embodiment system for implementing embodiment overcurrent or short circuit detection, such as desaturation detection, with adjustable desaturation thresholds based on gate drive voltage. In various embodiments, power generator 142 is a device that produces a DC signal, such as a solar panel or wind turbine. Although shown as a single block, it should be appreciated that power generator 142 may include many devices, such as multiple wind turbines in a wind farm. Inverter 144 receives the DC signal from power generator 142 and produces an AC signal. In some embodiments, inverter 144 may be a multi-branch device, such as a neutral point clamped (NPC) inverter. Driver 146 produces a drive input for the gates of power switches in inverter 144. Load 148 is powered by the AC signal, and may be indicative of a larger electrical distribution grid or the like, for example. According to other embodiments, power system 140 may also correspond to one or more motor inverters supplied from by a power source, such as from the larger electrical distribution grid, which may include many types of power generation, for example.

According to various embodiments, driver 146 senses desaturation, for example, of power switches in inverter 144 and may turn off inverter 144 or notify other systems of the failure. In some embodiments, driver 146 generates fault signal FAULT, which is supplied to microcontroller 150. In the embodiment shown in FIG. 6, driver 146 notifies power generator 142 and microcontroller 150 of inverter failure, but other operators or systems may be notified. Driver 146 evaluates the gate drive voltages of various power switches in inverter 144 and adjusts the desaturation threshold for the power switches of inverter 144 according to the gate drive voltages. Driver 146 may include any of the embodiment circuits or systems, or portions thereof, described herein in reference to the other figures. In various embodiments, microcontroller 150 may disable or enable driver 146, and consequently power switches in inverter 144, using enable signal ON/OFF based on, for example, fault signal FAULT.

Figure 7:
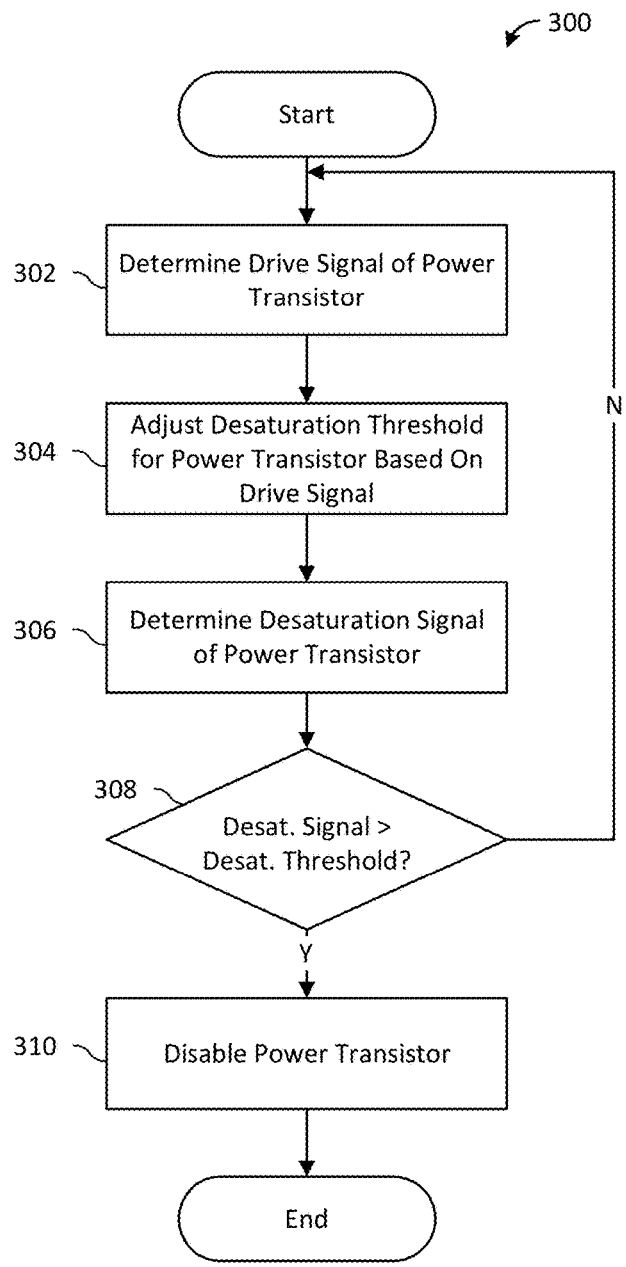
FIG. 7 illustrates a block diagram of an embodiment method of operating a control circuit for a power switch.

FIG. 7 illustrates a block diagram of an embodiment method of operation 300 for a control circuit for a power switch. According to various embodiments, method of operation 300 includes steps 302, 304, 306, 308, and 310. In various embodiments, step 302 includes determining a drive signal of a power transistor or a power switch. As described hereinabove in reference to the other figures, determining a drive signal may include determining a gate drive voltage, which may be measured directly at the gate, directly from a drive signal, or indirectly from a power supply for a gate driver. Step 304 includes adjusting a desaturation threshold for the power transistor based on the drive signal determined in step 302. In such embodiments, the desaturation threshold may be related to the gate drive voltage. For example, in some embodiments, the output characteristic of the power transistor may be known, determined, or set, and a nominal output current may also be set for the power transistor. Based on the nominal output current and the output characteristic, the desaturation threshold is set in some embodiments as the voltage drop across the power transistor corresponding to the intersection of the nominal output current and the output current characteristic for a given gate drive voltage.

According to various embodiments, step 306 includes determining a desaturation signal of the power transistor. Step 306 may include measuring the voltage drop across the power transistor. In some embodiments, the voltage drop across the power transistor may be determined through a measurement interface circuit that decouples the high voltages at the power transistor from the control logic in the controller IC or the like. The voltage drop may be measured by measuring the voltage at the high voltage conduction node of the power transistor using the measurement interface circuit. Based on the determined desaturation signal, step 308 includes comparing the desaturation signal to the desaturation threshold. If the desaturation signal is greater than the desaturation threshold, step 310 follows step 308. If the desaturation signal is not greater than the desaturation threshold, step 302 may follow step 308 in order to begin method of operation 300 again. Step 310 includes disabling the power transistor. In some embodiments, step 310 may include disabling additional elements of the overall system, for example, or notifying various system control elements of the desaturation detection.

According to various embodiments, method of operation 300 may be repeated during operation indefinitely. Method of operation 300 may include additional steps, modification of the listed steps, rearrangement of the listed steps, or, in some alternative cases, omission of some of the listed steps. In various embodiments, method of operation may be divided into independent control loops. In such embodiments, steps 302, 304, and 306 may be performed as a first control loop for adjusting the desaturation threshold for the power transistor and determine the desaturation signal of the power transistor, while steps 308 and 310 are performed as a second control loop for comparing the desaturation signal to the desaturation threshold and disabling the power transistor based on the comparison. In such various embodiments, step 306 may also be operated as a separate process independent of the first control loop and the second control loop.

Various embodiment desaturation detection circuits may include advantages such as increased overcurrent detection accuracy, reduced sensitivity to noise, reduced false desaturation detections, improved robustness and protection of power switches, extended operating lifetimes of power switches, and greater reliability.

Example embodiments of the present invention are summarized here. Other embodiments can also be understood form the entirety of the specification and the claims filed herein.

Example 1. A method of operating a control circuit including generating a threshold value based on a drive signal of an external power transistor; and determining an overpower state of the external power transistor based on a voltage at a drain or a collector of the external power transistor and the threshold value.

Example 2. The method of example 1, where generating the threshold value includes determining the drive signal of the external power transistor using an analog-to-digital converter (ADC); setting the threshold value appropriate for the external power transistor based on the drive signal using a digital-to-analog converter (DAC); and comparing the voltage at the drain or the collector of the external power transistor to the threshold value using a comparator.

Example 3. The method of example 1, where generating the threshold value includes determining the drive signal of the external power transistor using an analog-to-digital converter (ADC); comparing the voltage at the drain or the collector of the external power transistor to the threshold value using a comparator; and adjusting the threshold value by adjusting a filter time constant.

Example 4. The method of one of examples 1 to 3, further including disabling the external power transistor when the voltage at the drain or the collector of the external power transistor exceeds the threshold value.

Example 5. The method of one of examples 1-4, further including measuring the voltage at the drain or the collector of the external power transistor.

Example 6. The method of one of examples 1-5, where generating the threshold value includes determining a gate drive voltage of the external power transistor; and adjusting the threshold value for the external power transistor based on the gate drive voltage.

Example 7. The method of example 6, where determining the gate drive voltage comprises measuring a supply voltage of a driver for the external power transistor.

Example 8. The method of example 6, where determining the gate drive voltage comprises measuring the gate drive voltage directly.

Example 9. A circuit including: a threshold generation circuit configured to generate a threshold value based on a drive signal of an external power transistor; and an overpower determination circuit configured to determine an overpower state of the external power transistor based on a voltage at a drain or a collector of the external power transistor and the threshold value.

Example 10. The circuit of example 9, where the threshold generation circuit includes: an analog-to-digital converter (ADC) configured to sample a signal indicative of the drive signal of the external power transistor and output a digital representation of the signal indicative of the drive signal of the external power transistor, a threshold adjustment circuit coupled to the ADC and configured to set the threshold value for the external power transistor based on the digital representation of the signal indicative of the drive signal of the external power transistor; and the overpower determination circuit comprises a comparator configured to compare the voltage at the drain or the collector of the external power transistor to the threshold value and generate a disable signal for the external power transistor when the voltage at the drain or the collector of the external power transistor is greater than the threshold value.

Example 11. The circuit of example 9, wherein the threshold generation circuit includes an analog-to-digital converter (ADC) configured to sample a signal indicative of the drive signal of the external power transistor and output a digital representation of the signal indicative of the drive signal of the external power transistor; and the overpower determination circuit includes a comparator configured to compare the voltage at the drain or the collector of the external power transistor to a desaturation threshold value and generate a comparison signal when the voltage at the drain or the collector of the external power transistor is greater than the desaturation threshold value, and a filter coupled to the ADC and the comparator, the filter configured to adjust the threshold value for the external power transistor based on the digital representation of the signal indicative of the drive signal of the external power transistor, where adjusting the threshold value for the external power transistor comprises adjusting a time constant of the filter, receive the comparison signal from the comparator, filter the comparison signal using the time constant of the filter, and generate a filtered comparison signal based on filtering the comparison signal.

Example 12. The circuit of one of examples 9-11, where the overpower determination circuit is further configured to disable the external power transistor when the voltage at the drain or the collector of the external power transistor is greater than the threshold value.

Example 13. The circuit of one of examples 9-12, further including a measurement circuit configured to be coupled to the external power transistor, the measurement circuit configured to measure the voltage at the drain or the collector of the external power transistor.

Example 14. The circuit of one of examples 9-13, wherein the threshold generation circuit is further configured to determine the drive signal of the external power transistor. Determining the drive signal of the external power transistor includes determining a gate drive voltage; and generating the threshold value for the external power transistor includes adjusting the threshold value for the external power transistor based on the gate drive voltage.

Example 15. The circuit of example 14, where the overpower determination circuit includes a driver configured to be coupled to the external power transistor; and determining the gate drive voltage includes measuring a supply voltage of the driver.

Example 16. The circuit of claim 14, where determining the gate drive voltage includes measuring the gate drive voltage directly.

Example 17. An electronic circuit comprising:
a measurement circuit comprising a first input configured to be coupled to an external power transistor and a measurement output;
a threshold circuit comprising
a second input configured to receive an indication of a gate drive voltage of the external power transistor, and
a threshold output, the threshold output being set based on the indication of the gate drive voltage received at the second input;
a comparator comprising
a third input coupled to the measurement output,
a fourth input coupled to the threshold output, and
a comparison output; and
a drive circuit configured to be coupled to the external power transistor and coupled to the comparison output, the drive circuit configured to disable the external power transistor based on signals at the comparison output.

18. The electronic circuit of claim 17, further comprising the external power transistor.

19. The electronic circuit of claim 17, wherein the second input is coupled to a gate of the external power transistor.

20. The electronic circuit of claim 17, wherein the second input is coupled to a power supply terminal of the drive circuit.

21. The electronic circuit of claim 17, wherein the external power transistor comprises a metal-oxide-semiconductor field effect transistor (MOSFET), and the first input is configured to be coupled to a drain of the MOSFET.

22. The electronic circuit of claim 21, wherein the external power transistor comprises a silicon carbide (SiC) MOSFET.

23. The electronic circuit of claim 17, wherein the external power transistor comprises an insulated-gate bipolar transistor (IGBT), and the first input is configured to be coupled to a collector of the IGBT.

24. The electronic circuit of claim 17, wherein the threshold circuit comprises:
an analog-to-digital converter (ADC) coupled to the second input and configured to receive the indication of the gate drive voltage of the external power transistor; and
a digital-to-analog converter (DAC) configured to provide the threshold output based on the indication of the gate drive voltage received at the second input.

25. The electronic circuit of claim 17, wherein the measurement circuit comprises:
a measurement resistor;
a measurement diode coupled in series with the measurement resistor, the measurement resistor and the measurement diode forming a series path from the measurement output to the first input; and
a measurement current source coupled to the measurement output and configured to force a measurement current through the measurement resistor and the measurement diode.

26. The electronic circuit of claim 17, further comprising a logic circuit coupled from the comparison output to the drive circuit, wherein the logic circuit is configured to disable the external power transistor when the measurement output exceeds the threshold output.

27. The electronic circuit of claim 17, wherein the comparator comprises:
a threshold comparator comprising a first comparison input coupled to the third input, a second comparison input coupled to a desaturation threshold, and an initial comparison output; and
a filter comprising a filter input coupled to the initial comparison output, a filter control input coupled to the fourth input, and a filter output coupled to the comparison output, wherein the filter has a filter time constant, the filter time constant being adjusted based on the gate drive voltage of the external power transistor.

According to various embodiments described herein, various structures and methods are described in reference to overcurrent and short circuit detection for power switches. Although description is made in some cases to overcurrent detection for MOSFETs, or SiC MOSFETs, for example, description is generally presented herein in reference to desaturation detection for IGBTs or BJTs for the sake of simplicity. According to various embodiments described herein, overcurrent and short circuit detection is implemented for various power switch types, such as, for example, MOSFETs, IGBTs, or BJTs. It should be appreciated by those of skill in the art that, although the underlying physical operation of specific devices, such as, e.g., desaturation in an IGBT, may be different in other types of devices, such as, e.g., saturation in a MOSFET, the methods and apparatuses described herein in reference to overcurrent and short circuit detection extend to devices of various types in various different embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of operating a control circuit, the method comprising:
generating a threshold value based on a drive signal of an external power transistor; and
determining an overpower state of the external power transistor based on a voltage at a drain or a collector of the external power transistor and the threshold value.

2. The method of claim 1, wherein generating the threshold value comprises
determining the drive signal of the external power transistor using an analog-to-digital converter (ADC);
setting the threshold value appropriate for the external power transistor based on the drive signal using a digital-to-analog converter (DAC); and
comparing the voltage at the drain or the collector of the external power transistor to the threshold value using a comparator.

3. The method of claim 1, wherein generating the threshold value comprises
determining the drive signal of the external power transistor using an analog-to-digital converter (ADC);
comparing the voltage at the drain or the collector of the external power transistor to the threshold value using a comparator; and adjusting the threshold value by adjusting a filter time constant.

4. The method of claim 1, further comprising disabling the external power transistor when the voltage at the drain or the collector of the external power transistor exceeds the threshold value.

5. The method of claim 1, further comprising measuring the voltage at the drain or the collector of the external power transistor.

6. The method of claim 1, wherein generating the threshold value comprises
   determining a gate drive voltage of the external power transistor; and
   adjusting the threshold value for the external power transistor based on the gate drive voltage.

7. The method of claim 6, wherein determining the gate drive voltage comprises measuring a supply voltage of a driver for the external power transistor.

8. The method of claim 6, wherein determining the gate drive voltage comprises measuring the gate drive voltage directly.

9. A circuit comprising:
   a threshold generation circuit configured to generate a threshold value based on a drive signal of an external power transistor; and
   an overpower determination circuit configured to determine an overpower state of the external power transistor based on a voltage at a drain or a collector of the external power transistor and the threshold value.

10. The circuit of claim 9, wherein
    the threshold generation circuit comprises:
       an analog-to-digital converter (ADC) configured to sample a signal indicative of the drive signal of the external power transistor and output a digital representation of the signal indicative of the drive signal of the external power transistor,
       a threshold adjustment circuit coupled to the ADC and configured to set the threshold value for the external power transistor based on the digital representation of the signal indicative of the drive signal of the external power transistor; and
    the overpower determination circuit comprises a comparator configured to compare the voltage at the drain or the collector of the external power transistor to the threshold value and generate a disable signal for the external power transistor when the voltage at the drain or the collector of the external power transistor is greater than the threshold value.

11. The circuit of claim 9, wherein
    the threshold generation circuit comprises an analog-to-digital converter (ADC) configured to sample a signal indicative of the drive signal of the external power transistor and output a digital representation of the signal indicative of the drive signal of the external power transistor; and
    the overpower determination circuit comprises
       a comparator configured to compare the voltage at the drain or the collector of the external power transistor to a desaturation threshold value and generate a comparison signal when the voltage at the drain or the collector of the external power transistor is greater than the desaturation threshold value, and
       a filter coupled to the ADC and the comparator, the filter configured to
          adjust the threshold value for the external power transistor based on the digital representation of the signal indicative of the drive signal of the external power transistor, wherein adjusting the threshold value for the external power transistor comprises adjusting a time constant of the filter,
          receive the comparison signal from the comparator,
          filter the comparison signal using the time constant of the filter, and
          generate a filtered comparison signal based on filtering the comparison signal.

12. The circuit of claim 9, wherein the overpower determination circuit is further configured to disable the external power transistor when the voltage at the drain or the collector of the external power transistor is greater than the threshold value.

13. The circuit of claim 9, further comprising a measurement circuit configured to be coupled to the external power transistor, the measurement circuit configured to measure the voltage at the drain or the collector of the external power transistor.

14. The circuit of claim 9, wherein the threshold generation circuit is further configured to determine the drive signal of the external power transistor, wherein
    determining the drive signal of the external power transistor comprises determining a gate drive voltage; and
    generating the threshold value for the external power transistor comprises adjusting the threshold value for the external power transistor based on the gate drive voltage.

15. The circuit of claim 14, wherein
    the overpower determination circuit comprises a driver configured to be coupled to the external power transistor; and
    determining the gate drive voltage comprises measuring a supply voltage of the driver.

16. The circuit of claim 14, wherein determining the gate drive voltage comprises measuring the gate drive voltage directly.

17. An electronic circuit comprising:
    a measurement circuit comprising a first input configured to be coupled to an external power transistor and a measurement output;
    a threshold circuit comprising
       a second input configured to receive an indication of a gate drive voltage of the external power transistor, and
       a threshold output, the threshold output being set based on the indication of the gate drive voltage received at the second input;
    a comparator comprising
       a third input coupled to the measurement output,
       a fourth input coupled to the threshold output, and
       a comparison output; and
    a drive circuit configured to be coupled to the external power transistor and coupled to the comparison output, the drive circuit configured to disable the external power transistor based on signals at the comparison output.

18. The electronic circuit of claim 17, further comprising the external power transistor.

19. The electronic circuit of claim 17, wherein the second input is coupled to a gate of the external power transistor.

20. The electronic circuit of claim 17, wherein the second input is coupled to a power supply terminal of the drive circuit.

21. The electronic circuit of claim 17, wherein the external power transistor comprises a metal-oxide-semiconductor field effect transistor (MOSFET), and the first input is configured to be coupled to a drain of the MOSFET.

22. The electronic circuit of claim 21, wherein the external power transistor comprises a silicon carbide (SiC) MOSFET.

23. The electronic circuit of claim 17, wherein the external power transistor comprises an insulated-gate bipolar transistor (IGBT), and the first input is configured to be coupled to a collector of the IGBT.

24. The electronic circuit of claim 17, wherein the threshold circuit comprises:
- an analog-to-digital converter (ADC) coupled to the second input and configured to receive the indication of the gate drive voltage of the external power transistor; and
- a digital-to-analog converter (DAC) configured to provide the threshold output based on the indication of the gate drive voltage received at the second input.

25. The electronic circuit of claim 17, wherein the measurement circuit comprises:
- a measurement resistor;
- a measurement diode coupled in series with the measurement resistor, the measurement resistor and the measurement diode forming a series path from the measurement output to the first input; and
- a measurement current source coupled to the measurement output and configured to force a measurement current through the measurement resistor and the measurement diode.

26. The electronic circuit of claim 17, further comprising a logic circuit coupled from the comparison output to the drive circuit, wherein the logic circuit is configured to disable the external power transistor when the measurement output exceeds the threshold output.

27. The electronic circuit of claim 17, wherein the comparator comprises:
- a threshold comparator comprising a first comparison input coupled to the third input, a second comparison input coupled to a desaturation threshold, and an initial comparison output; and
- a filter comprising a filter input coupled to the initial comparison output, a filter control input coupled to the fourth input, and a filter output coupled to the comparison output, wherein the filter has a filter time constant, the filter time constant being adjusted based on the gate drive voltage of the external power transistor.

* * * * *